United States Patent [19]

Burke et al.

[11] 4,241,423
[45] Dec. 23, 1980

[54] OPTICAL MEMORY WITH INJECTION LASER AS LIGHT SOURCE AND DETECTOR

[75] Inventors: William J. Burke, Princeton Junction; Henry Kressel, Elizabeth; Michael Ettenberg, Freehold, all of N.J.

[73] Assignee: RCA Corporation, New York, N.Y.

[21] Appl. No.: 972,405

[22] Filed: Dec. 22, 1978

[51] Int. Cl.³ ............................................. G11C 13/08
[52] U.S. Cl. .................................. 365/215; 358/128.5
[58] Field of Search ................ 365/215; 179/100.3 V, 179/100.3 Z; 358/128; 250/570

[56] References Cited

U.S. PATENT DOCUMENTS

| | | | |
|---|---|---|---|
| 3,941,945 | 3/1976 | Borner et al. | 365/215 |
| 3,992,575 | 11/1976 | Velzel et al. | 179/100.3 V |
| 4,005,259 | 1/1977 | Kaneko | 179/100.3 V |
| 4,032,776 | 6/1977 | Rosmalen | 179/100.3 V |
| 4,074,312 | 2/1978 | Rosmalen | 179/100.3 V |
| 4,190,775 | 2/1980 | Sakurai et al. | 250/570 |

OTHER PUBLICATIONS

Mitsuhashi et al., Self-Coupled Optical Pickup, Optics Communications, vol. 17, No. 1, pp. 95-97, 4/76.
Bartolini et al., "Optical Disk Systems Emerge," IEEE Spectrum, 8/78, pp. 20-28.

*Primary Examiner*—Stuart N. Hecker
*Attorney, Agent, or Firm*—H. Christoffersen; D. S. Cohen

[57] ABSTRACT

In an optical memory device, such as an optical video disk, an injection laser is used as the source of the light, as the detector of the light reflected from the memory element and as the detector for controlling the proper focus of the light on the memory element. The light reflected from the memory element is fed back into the injection laser and variations in certain characteristics of the injection laser, such as the optical output at constant current, the electrical current through the laser at constant voltage and the voltage drop across the laser at constant current, are used to read the memory device and to maintain the focus.

7 Claims, 2 Drawing Figures

OPTICAL MEMORY WITH INJECTION LASER AS LIGHT SOURCE AND DETECTOR

BACKGROUND OF THE INVENTION

The present invention relates to an optical memory utilizing an injection laser and particularly to such a memory in which the injection laser is not only used as the source of light beam but also as the detector for reading the memory element and for maintaining the proper focus of the light beam on the memory element.

Memory devices have been developed in which the information is recorded and read out optically. One such device includes a rotatable disk having the information recorded thereon as the memory element a radiation source, an optical system for collecting radiation from the radiation source and focusing the radiation onto the disk, and a radiation sensitive detection system for converting into an electrical signal the radiation reflected back from the disk and modulated by the information on the disk. The device also generally includes an additional radiation sensitive detection system for maintaining the focal plane of the optical system at the reflective surface of the disk and thereby maintain the proper focus of the radiation on the disk.

If the radiation source is a semiconductor injection laser, it has been found that the injection laser can also be used as the detection system for the modulated reflected radiation. As described in the article of Y. Mitsuhashi et al. entitled "SELF-COUPLED OPTICAL PICKUP," Optic Communications, Vol. 17, No. 1, Apr. 1976, pp. 95-97, when the modulated radiation is reflected back into the injection laser, certain characteristics of the injection laser such as the light output at constant current, the electrical current through the laser at constant voltages and the voltage drop across the laser at constant current, will vary corresponding to the modulation of the light. Thus, the variation in these characteristics of the injection laser with the modulation of the reflected radiation can be used to indicate the modulation. Therefore, the injection laser can be used as both the source of the radiation and the detector of the modulated radiation reflected from the disk. However, this system still requires a separate detector for maintaining the focal plane of the optical system on the reflective surfaces of the disk.

SUMMARY OF THE INVENTION

An optical memory device which includes an injection laser as the source of radiation and the detector for the reflected radiation, a memory element adapted to receive the radiation from the injection laser and reflect back at least some of the radiation which is modulated according to information in the memory element and means between the injection laser and memory element for focusing the radiation on the memory element, also includes means for detecting the modulated current in the injection laser which results from the modulated reflected radiation entering the injection laser. The device also includes means subject to variations in certain characteristics of the injection laser for varying the spacing between the memory element and the focusing means so as to maintain the radiation focused on the memory element.

DETAILED DESCRIPTION

Figure 1:
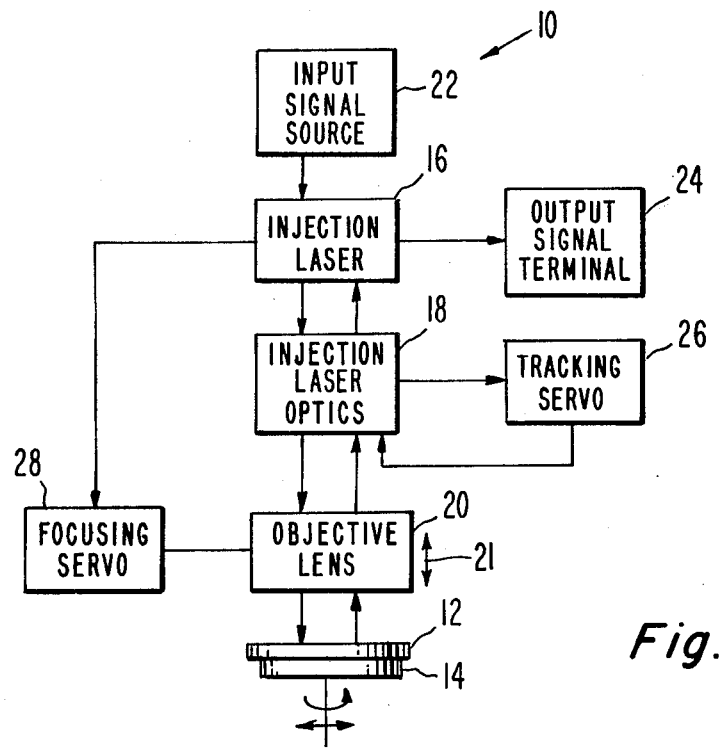
FIG. 1 is a schematic representation of an optical memory device which includes the focusing means of the present invention.

Referring to FIG. 1, an optical memory device which includes the focusing means of the present invention is generally designated as 10. The memory device 10 includes a memory element 12, which is shown in the form of a disk containing the recorded information. The recorded information may be in the form of openings in a layer of a reflecting material on the surface of the memory element arranged along a spiral path. The memory element 12 is mounted on a turntable 14 which is adapted to be rotated about an axis perpendicular to the memory element and be moved in a direction parallel to the surface of the memory element.

An injection laser 16 is mounted so that the light emitted by the injection laser 16 is directed toward the surface of the memory element 12. The injection laser 16 may be of any structure well known in the art but is preferably a double heterojunction laser of the type described in an article by H. Kressel et al., entitled "LIGHT SOURCES" in Physics Today, Vol. 29, pp. 38-47, May, 1976. Between the injection laser 16 and the memory element 12 is the injection laser optical system 18 which serves to collect the light from the injection laser 16 and form it into a narrow beam. The injection laser optical system 18 may include a 20×/0.35 NA microscopic objective. Between the injection laser optical system 18 and the memory element 12 is an objective means 20 for focusing the light into the surface of the memory disk 12. This may be a 50×/0.85 NA focusing objective lens.

An input signal source 22 is connected to the injection laser 16. The input signal source 22 provides a signal which modulates the output of the injection laser 16 when the injection laser 16 is used for recording information in the memory element 12. An output signal terminal 24 is also connected to the injection laser 16. The output signal terminal 24 detects variations in certain characteristics of the injection laser 16 when the injection laser 16 is used to read the information recorded in the memory element 12. The output signal terminal 24 may be a photocell and circuits for detecting variations in the optical output of the injection laser 16 or may be a circuit for detecting variations in the electrical current through or voltage drop across the injection laser 16.

A radial tracking servosystem 26 is connected to the injection laser optical system 18. The radial tracking servosystem 26 serves to insure that the light from the injection laser 16 follows the information track of the memory element 12. One technique for sensing tracking errors is to include in the injection laser optical system 18 a mirror that dithers back and forth across the information track at a frequency much higher than that of any expected tracking errors. This will cause the light from the injection laser 16 to dither back and forth across the information track resulting in a variation in the modulation of the reflected light at the dither frequency. Part of the light reflected from the memory element 12 is fed to a photodetector which detects this variation. The signal from the photodetector is then fed to the tracking servo 26 which can adjust the position of the mirror so that the center or rest position of the mirror is coincident with the information track. This technique is described in the article of R. A. Bartolini et al. entitled "OPTICAL DISC SYSTEMS EMERGE," in IEEE Spectrum, Aug. 1978, pp. 20–28.

A focusing servomechanism 28 is connected between the injection laser 16 and the objective lens 20. The purpose of the focus servomechanism 28 is to maintain the proper position between the objective lens and the memory element 12 so as to maintain the focus of the light from the injection laser 16 onto the memory element 12. To achieve this proper focus the objective lens 20 is dithered back and forth along an axis parallel to its optical axis as indicated by arrow 21 at a frequency different from that of the tracking dither. As will be explained in detail later, variations in the spacing between the objective lens 20 and the memory element 12 will cause variations in certain characteristics of the injection laser 16. These variations are fed to the focus servomechanism 28 which will correspondingly adjust the center position of the dither of the objective lens 20. The objective lens 20 can be dithered by means of a loudspeaker-type voice coil. This would include a coil wound around the lens with the lens and coil being placed inside a permanent magnet. Current applied to the coil moves the lens to achieve the dither. This means for causing the lens to dither is considered a part of the focusing servomechanism 28.

In the operation of the memory device 10 for reading information from the memory element 12, the light from the injection laser 16 passes through the injection laser optical system 18 and the objective lens 20 onto the memory element 12. The light reflected from the memory element 12 is modulated according to the recorded information on the element 12. The reflected light passes through the objective lens 20 and injection laser optical system 18 and is incident on the injection laser 16. The modulated light passing back into the injection laser 16 will cause a variation in certain characteristics of the injection laser 16, such as the optical output of the injection laser at constant current, the electrical current through the laser at constant voltage and the voltage drop across the laser at constant current. Any one of these variations in the characteristics of the injection laser 16 can be fed into the output signal terminal 24 to provide a reading of the information recorded on the memory element 12.

Figure 2:
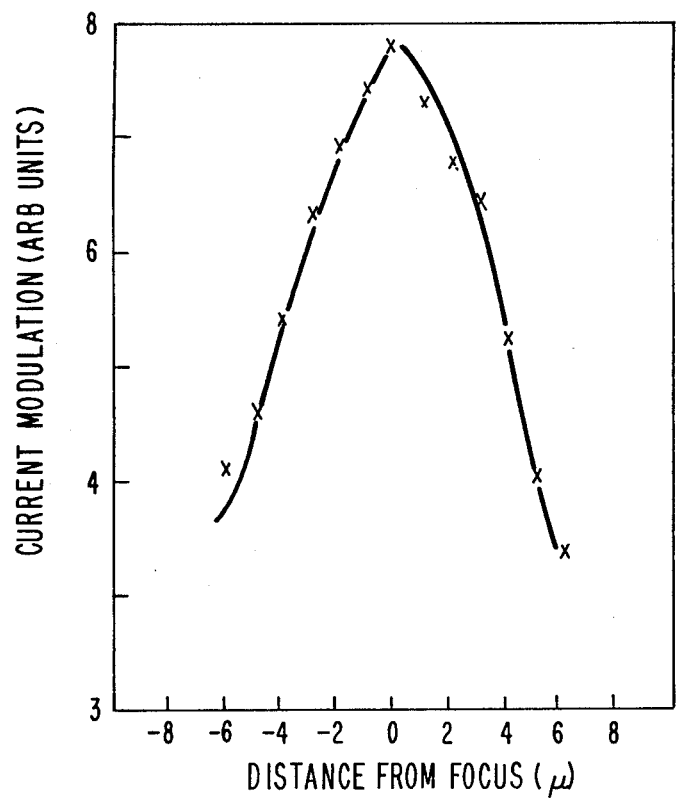
FIG. 2 is a graph showing the variation in the electrical characteristics of an injection laser with respect to variations in distance of the memory element from the focus plane of the optical system.

We have found that if the distance between the objective lens 20 and the memory element 12 is varied, which causes a variation in the spacing between the reflecting surface of the memory element 12 and the focal plane of the objective lens 20, the above stated characteristics of the injection laser will also vary accordingly. For example, as shown in FIG. 2, the amplitude of the current modulation of the injection laser 16 will be at a maximum when the distance between the objective lens 20 and the memory element 12 is such that the light is in focus. As this distance varies, either the objective lens becomes closer to the memory disk 12 or is moved further away, the amplitude of the dither current modulation decreases from that maximum point. Thus, by feeding the amplitude of the dither current modulation to the focusing servomechanism 28, the focusing servomechanism 28 can adjust the position of the objective lens 20 to maintain the light focused on the memory element 12. By having the objective lens 20 dither, there is provided to the focusing servomechanism 28 a signal which will indicate whether the objective lens 20 is either too far away from or too close to the element 12 so that the focus servomechanism 28 can adjust the position of the objective lens 20 accordingly. Assuming that the objective lens 20 is dithered about a center position first away from and then toward, the memory element 12 it can be seen from FIG. 2 that if the center position of the dither is out of focus away from the memory disk 12 the amplitude of the current modulation will first increase and then decrease. However, if the center of the dither is out of focus toward the memory element 12 the amplitude of the current modulation will first decrease and then increase. Thus, the focusing servomechanism 28 can distinguish between whether the objective lens 20 is out of focus either toward or away from the memory element 12 and can cause the objective lens 20 to move accordingly to the focus position where the amplitude of the current modulation will, upon the dithering of the objective lens 20, decrease in both directions of the dither from the center position. Variations in either the optical output of the injection laser or the voltage drop across the laser can be similarly used to maintain the focus.

Thus, in the memory device 10 of the present invention the light reflected back from the memory element 12 is fed back into the injection laser 16 to cause a variation in the output characteristics of the injection laser. The variation in certain of these characteristics is used to provide a read out of the memory element 12 and maintain the light from the injection laser 16 focused on the memory element 12.

We claim:

1. An optical memory device which includes an injection laser as a source of radiation and the detector of the reflected modulated radiation, a memory element adapted to receive the radiation from the injection laser and to reflect back at least some of the radiation modulated by information contained in the memory element, and means for focusing a spot of the radiation from the injection laser onto the memory element, the improvement comprising:

means for modulating the focus of the spot of light, means for detecting variations in a characteristic of the injection laser resulting from the modulation of the focus and means for adjusting the focusing means to a position in which the variation resulting from the modulation of the focus is at a minimum so as to bring the radiation into focus on the memory element.

2. An optical memory device in accordance with claim 1 in which the means for detecting variations in a characteristic of the injection laser detects variations in the amplitude of the current modulation of the injection laser.

3. An optical memory device in accordance with claim 1 in which the means for detecting variations in a characteristic of the injection laser detects variations in the optical output of the laser at constant current.

4. An optical memory device in accordance with claim 1 in which the means for detecting variations in a characteristic of the injection laser detects variations in the voltage drop across the laser at constant current.

5. An optical memory device in accordance with claim 1 including an objective lens between the injection laser and the memory element for focusing the radiation from the injection laser on the memory element and wherein the means for detecting the variation in the characteristic of the injection laser causes movement of the objective lens with respect to the memory element to bring the radiation into focus on the memory element.

6. An optical memory device in accordance with claim 5 in which the means for modulating the focus of the spot of light includes means for dithering the objective lens parallel to its optic axis about a center position toward and away from the memory element.

7. An optical memory device in accordance with claim 6 in which the memory element is a disk having the information thereon along a track and means for moving said disk so that the radiation from the injection laser follows the track.

* * * * *